(12) United States Patent
Bencher et al.

(10) Patent No.: US 7,807,578 B2
(45) Date of Patent: Oct. 5, 2010

(54) FREQUENCY DOUBLING USING SPACER MASK

(75) Inventors: Christopher D. Bencher, San Jose, CA (US); Keiji Horioka, Tokyo (JP)

(73) Assignee: Applied Materials, Inc., Santa Clara, CA (US)

( * ) Notice: Subject to any disclaimer, the term of this patent is extended or adjusted under 35 U.S.C. 154(b) by 139 days.

(21) Appl. No.: 11/875,250

(22) Filed: Oct. 19, 2007

(65) Prior Publication Data

US 2008/0299776 A1 Dec. 4, 2008

Related U.S. Application Data

(60) Provisional application No. 60/932,858, filed on Jun. 1, 2007.

(51) Int. Cl.
*H01L 21/311* (2006.01)
(52) U.S. Cl. .............................. 438/703; 257/E21.249
(58) Field of Classification Search .............. 438/703; 257/E21.249
See application file for complete search history.

(56) References Cited

U.S. PATENT DOCUMENTS

| 5,328,810 | A | 7/1994 | Lowrey et al. |
| 6,924,191 | B2 | 8/2005 | Liu et al. |
| 7,115,525 | B2 | 10/2006 | Abatchev et al. |
| 2004/0018738 | A1* | 1/2004 | Liu ............................ 438/700 |
| 2006/0046200 | A1* | 3/2006 | Abatchev et al. ............ 430/313 |
| 2006/0046484 | A1* | 3/2006 | Abatchev et al. ............ 438/689 |
| 2006/0240361 | A1* | 10/2006 | Lee et al. ..................... 430/313 |
| 2008/0090419 | A1* | 4/2008 | Koh et al. .................... 438/696 |
| 2008/0299465 | A1* | 12/2008 | Bencher et al. ................. 430/5 |
| 2009/0017631 | A1* | 1/2009 | Bencher ...................... 438/703 |

* cited by examiner

*Primary Examiner*—Hsien-ming Lee
*Assistant Examiner*—Walter H Swanson
(74) *Attorney, Agent, or Firm*—Blakely Sokoloff Taylor & Zafman LLP

(57) ABSTRACT

A method for fabricating a semiconductor mask is described. A semiconductor stack having a sacrificial mask and a spacer mask is first provided. The sacrificial mask is comprised of a series of lines and the spacer mask has spacer lines adjacent to the sidewalls of the series of lines. Next, the spacer mask is cropped. Finally, the sacrificial mask is removed to provide a cropped spacer mask. The cropped spacer mask doubles the frequency of the series of lines of the sacrificial mask.

10 Claims, 11 Drawing Sheets

FREQUENCY DOUBLING USING SPACER MASK

CROSS REFERENCE TO RELATED APPLICATIONS

This application claims the benefit of U.S. Provisional Application No. 60/932,858, filed Jun. 1, 2007, which is hereby incorporated by reference. This application is related to U.S. patent application Ser. No. 12/119,836, entitled "SELF-ALIGNED PILLAR PATTERNING USING MULTIPLE SPACER MASKS" filed May 13, 2008, and U.S. patent application Ser. No. 11/875,205, entitled "FREQUENCY TRIPLING USING SPACER MASK HAVING INTERPOSED REGIONS" filed Oct. 19, 2007.

BACKGROUND

1) Field

Embodiments of the present invention pertain to the field of Semiconductor Processing. More particularly, embodiments of the present invention relate to a method of fabricating a semiconductor device.

2) Description of Related Art

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of logic and memory devices on a microprocessor, lending to the fabrication of products with increased complexity.

Scaling has not been without consequence, however. As the dimensions of the fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features. FIGS. 1A-C illustrate cross-sectional views representing a conventional semiconductor lithographic process, in accordance with the prior art.

Referring to FIG. 1A, a photoresist layer 104 is provided above a semiconductor stack 102. A mask or reticle 106 is positioned above the photoresist layer 104. A lithographic process includes exposure of the photoresist layer 104 to light (hv) having a particular wavelength, as indicated by the arrows in FIG. 1A. Referring to FIG. 1B, the photoresist layer 104 is subsequently developed to provide the patterned photoresist layer 108 above the semiconductor stack 102. That is, the portions of the photoresist layer 104 that were exposed to light are now removed. The width of each feature of the patterned photoresist layer 108 is depicted by the width 'x.' The spacing between each feature is depicted by the spacing 'y.' Typically, the limit for a particular lithographic process is to provide features having a critical dimension equal to the spacing between the features, i.e. x=y, as depicted in FIG. 1B.

Referring to FIG. 1C, the critical dimension (i.e. the width 'x') of a feature may be reduced to form the patterned photoresist layer 110 above the semiconductor stack 102. The critical dimension may be shrunk by over-exposing the photoresist layer 104 during the lithographic operation depicted in FIG. 1A or by subsequently trimming the patterned photoresist layer 108 from FIG. 1B. However, this reduction in critical dimension comes at the expense of an increased spacing between features, as depicted by spacing 'y' in FIG. 1C. That is, there may be a trade-off between the smallest achievable dimension of each of the features from the patterned photoresist layer 110 and the spacing between each feature.

Thus, a method to double the frequency of a semiconductor lithographic process is described herein.

BRIEF DESCRIPTION OF THE DRAWINGS

Embodiments of the present invention are illustrated by way of examples and not limitations, in the figures of the accompanying drawings.

DETAILED DESCRIPTION

Figure 1A:
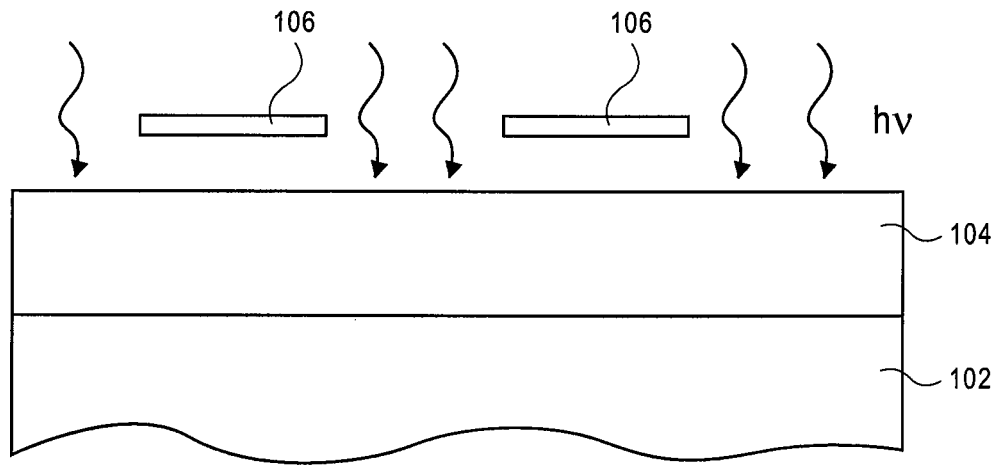
FIGS. 1A-C illustrate cross-sectional views representing a conventional semiconductor lithographic process, in accordance with the prior art.
Figure 1B:
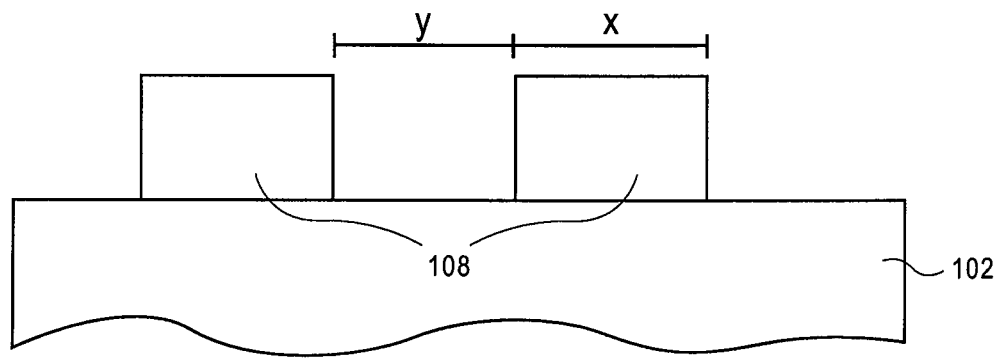
Figure 1C:
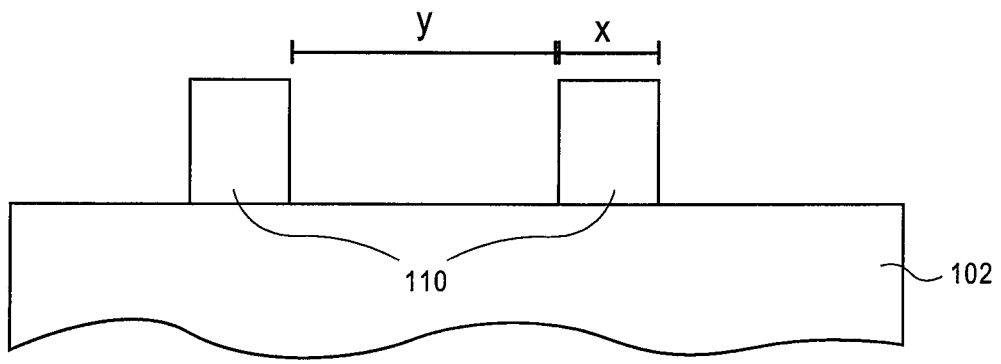

A method to double the frequency of a semiconductor lithographic process is described. In the following description, numerous specific details are set forth, such as fabrication conditions and material regimes, in order to provide a thorough understanding of the present invention. It will be apparent to one skilled in the art that the present invention may be practiced without these specific details. In other instances, well-known features, such as integrated circuit design layouts or photoresist development processes, are not described in detail in order to not unnecessarily obscure the present invention. Furthermore, it is to be understood that the various embodiments shown in the Figures are illustrative representations and are not necessarily drawn to scale.

In one embodiment, a method for fabricating a semiconductor mask is provided. A semiconductor stack having a sacrificial mask and a spacer mask may first be provided. In an embodiment, the sacrificial mask comprises a series of lines and the spacer mask has spacer lines adjacent to the sidewalls of the series of lines. The spacer mask is then cropped to provide a cropped spacer mask and the sacrificial mask is removed subsequent to the cropping of the spacer mask. In a specific embodiment, the spacer mask is formed by first depositing a spacer layer above the semiconductor stack and conformal with the sacrificial mask. The spacer layer is etched to provide the spacer mask having spacer lines adjacent to the sidewalls of the series of lines of the sacrificial mask and to expose the top surface of the sacrificial mask. A photoresist layer is then deposited and patterned above the spacer mask to expose a portion of the spacer mask. The exposed portion of the spacer mask is etched to crop the spacer mask. Finally, the sacrificial mask is removed, leaving only the cropped spacer mask.

The frequency of a lithographic pattern may be doubled by fabricating a spacer mask. For example, in accordance with an embodiment of the present invention, a spacer mask is fabricated having spacer lines formed adjacent to the sidewalls of a lithographically patterned sacrificial mask. As such, for every line in the sacrificial mask, two spacer lines of the spacer mask are generated. A semiconductor patterning mask providing substantially the same critical dimension for each line, or the same feature width, but having double the density of lines in a particular region may thus be fabricated upon removal of the sacrificial mask. For example, in accordance with an embodiment of the present invention, the pitch of the sacrificial mask is selected to be 4 in order to ultimately provide a spacer mask having a pitch of 2.

In order to provide spacer lines that do not wrap around the ends of the lines of the sacrificial mask, the spacer mask may need to be cropped. Damage to the spacer mask during a cropping operation may be prevented by retaining the sacrificial mask until the spacer mask has been cropped. For example, in accordance with an embodiment of the present invention, a spacer mask comprises spacer regions which are directly adjacent to the sidewalls of the lines in a sacrificial mask, including around the ends of each line. Each pair of spacer regions of the spacer mask associated with each line of the sacrificial mask is connected. It may be desirable to generate lines in the spacer mask that are discontinuous with one another. In one embodiment, the portions of the spacer mask that wrap around the ends of the lines in the sacrificial mask are cropped in a patterning/etch process. In the absence of the sacrificial mask, the spacer mask may not have sufficient integrity to endure the patterning/etch process. In accordance with one embodiment of the present invention, the sacrificial mask is retained during the cropping process in order to provide structural support to the spacer mask throughout the process. Upon cropping the spacer mask, the sacrificial mask may be removed to provide only the cropped spacer mask. In a specific embodiment, the image of the cropped spacer mask is subsequently transferred to a semiconductor stack.

Figure 2:
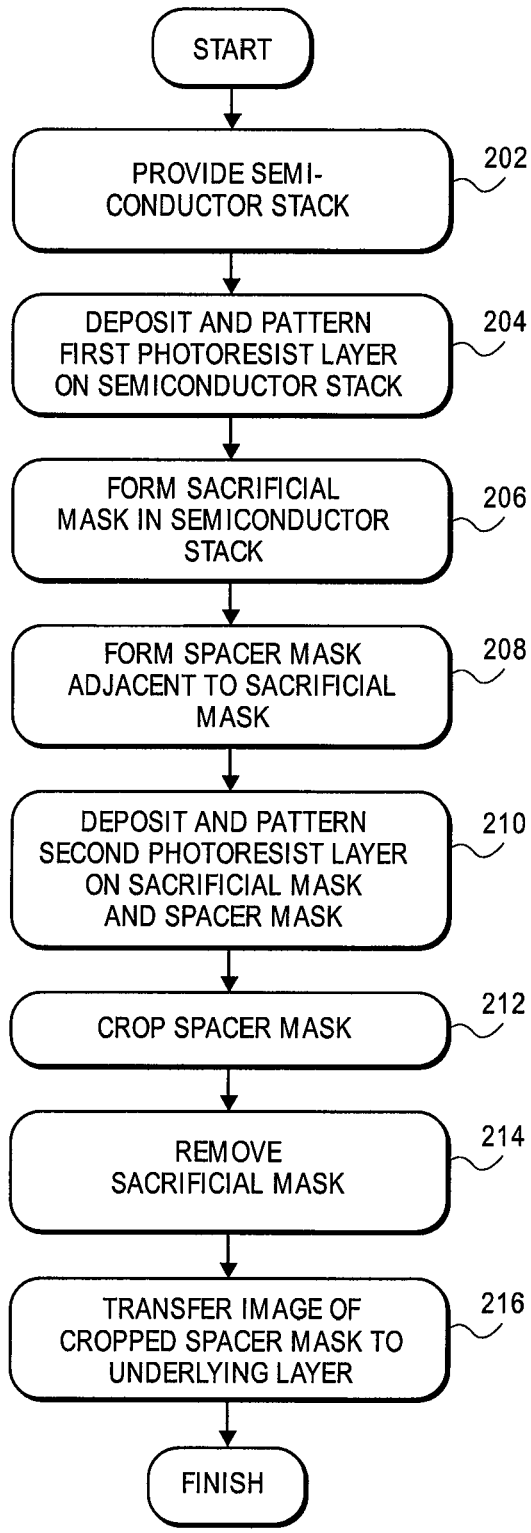
FIG. 2 illustrates an exemplary method of a spacer mask fabrication process, in accordance with an embodiment of the present invention.

The fabrication of a spacer mask may include a cropping process sequence, through which a sacrificial mask is retained to provide structural integrity to the spacer mask. FIG. 2 comprises a flowchart 200 representing an exemplary method of a spacer mask fabrication process, in accordance with an embodiment of the present invention. FIGS. 3A-H illustrate cross-sectional and top-down views accompanying the exemplary method from flowchart 200 as applied to a semiconductor stack, in accordance with an embodiment of the present invention.

Figure 3A:
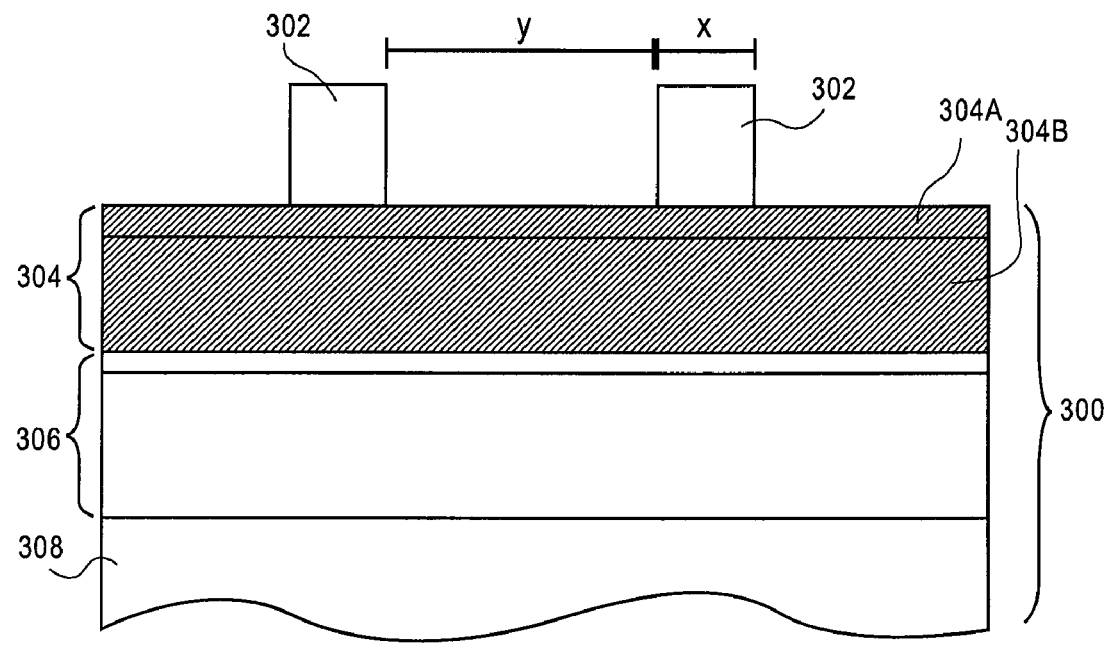
FIGS. 3A-H illustrate cross-sectional and top-down views representing a series of processes from the flowchart of FIG. 2 as applied to a semiconductor stack, in accordance with an embodiment of the present invention.

Referring to operations 202 and 204 of flowchart 200 and corresponding FIG. 3A, a patterned photoresist layer 302 is provided above a semiconductor stack 300. In one embodiment, the semiconductor stack 300 is comprised of a first mask stack 304 and a second mask stack 306 above a semiconductor layer 308.

The patterned photoresist layer 302 may be comprised of any material suitable for use in a lithographic process. In one embodiment, the patterned photoresist layer 302 may be formed by first masking a blanket layer of photoresist material and then exposing it to a light source. The patterned photoresist layer 302 may then be formed by developing the blanket photoresist layer. In an embodiment, the portions of the photoresist layer exposed to the light source are removed upon developing the photoresist layer. Thus, the patterned photoresist layer 302 is comprised of a positive photoresist material in the present embodiment. In a specific embodiment, the patterned photoresist layer 302 is comprised of a positive photoresist material selected from the group consisting of a 248 nm resist, a 193 nm resist, a 157 nm resist and a phenolic resin matrix with a diazonaphthoquinone sensitizer. In another embodiment, the portions of the photoresist layer exposed to the light source are retained upon developing the photoresist layer. Thus, the patterned photoresist layer 302 is comprised of a negative photoresist material in the present embodiment. In a specific embodiment, the patterned photoresist layer 302 is comprised of a negative photoresist material selected from the group consisting of poly-cis-isoprene and poly-vinyl-cinnamate.

The patterned photoresist layer 302 may have any dimensions suitable for a spacer mask fabrication process. In accordance with an embodiment of the present invention, the width 'x' of each feature of the patterned photoresist layer 302 is selected to substantially correlate with the desired critical dimension of a semiconductor device feature, e.g. the width of a space that defines a gate electrode. In one embodiment, the width 'x' is in the range of 10-100 nanometers. The spacing between lines 'y' may be selected to optimize a frequency doubling scheme. In accordance with an embodiment of the present invention, a subsequently fabricated spacer mask is targeted such that the width of the spacer lines of the spacer mask are substantially the same as the width 'x' of each feature of the patterned photoresist layer 302. Furthermore, the spacing between subsequently formed spacer lines is targeted to be substantially equal to the width of each spacer region. Thus, in one embodiment, because the frequency will ultimately be doubled, the spacing 'y' between each feature in the patterned photoresist 302 is approximately equal to 3 times the value 'x,' as depicted in FIG. 3A. The pitch of the patterned photoresist layer 302 is selected to be approximately 4 in order to ultimately provide a spacer mask with spacer lines having a pitch of approximately 2. In a specific embodiment, 193 nm lithography is used to generate the patterned photoresist layer 302 having a feature width of approximately 45 nanometers and a spacing between features of approximately 135 nanometers.

The approximate 3:1 spacing:width ratio for the features of the patterned photoresist layer 302 may be achieved by over-exposing a positive photoresist layer at the exposure operation or by trimming a photoresist layer subsequent to a lithographic/development process. In one embodiment, the patterned photoresist 302 is comprised of 193 nm positive photoresist that was trimmed post development by using a plasma etch chemistry. Although for a frequency doubling scheme the ideal width of each feature in the patterned photoresist layer 302 is ¼ the pitch of the patterned photoresist layer 302, the initial targeted width may be required to be slightly thicker to compensate for the etch process used to pattern the first mask stack 304. Thus in accordance with an embodiment of the present invention, the initial width of each line in the patterned photoresist layer 302 is targeted to be between 0.281 and 0.312 times the pitch.

Figure 3B:
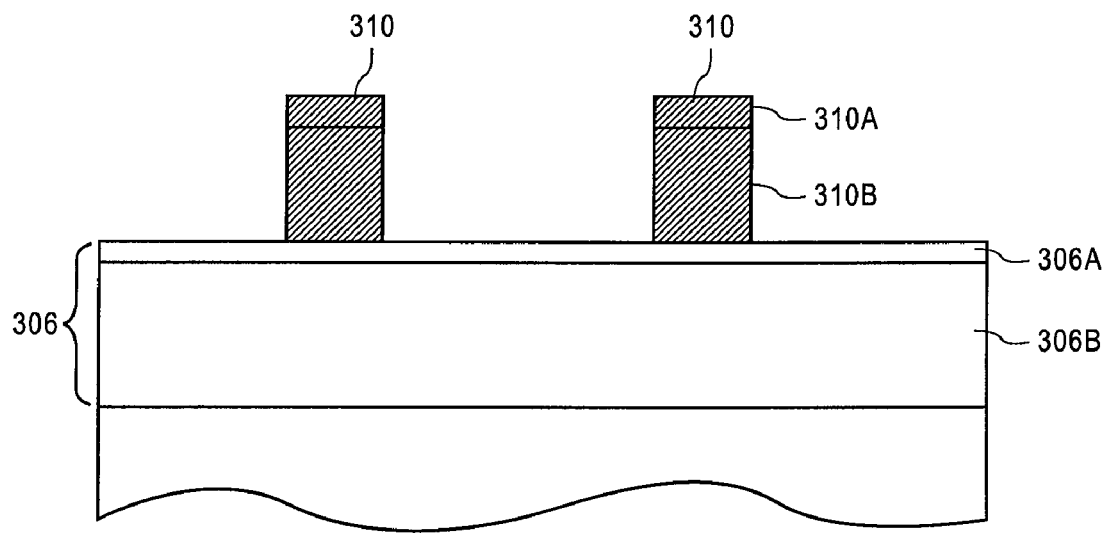

Referring to operation 206 of the flowchart 200 and corresponding FIG. 3B, the image of the patterned photoresist layer 302 is transferred to the first mask stack 304 by an etch process to form a sacrificial mask 310. The etch process used to transfer the image may be any process suitable to transfer substantially the same image from the patterned photoresist layer 302 to the first mask stack 304.

The first mask stack 304 and, hence, the sacrificial mask 310 may be comprised of any material or combination of materials suitable to act as a sacrificial mask in a spacer mask fabrication process. In accordance with an embodiment of the present invention, the first mask stack 304 is comprised of a single material, as indicated by the single shading depicted in FIG. 3A. The composition and thickness of first mask stack 304 comprised of a single material may be suitable for etching with an etch process that is substantially non-impactful to the patterned photoresist layer 302. In one embodiment, the dimensions and etch characteristics of the first mask stack 304 comprised of a single material are selected to be amenable to patterning during which the patterned photoresist layer 302 is retained substantially intact. In a specific embodiment, the patterned photoresist layer 302 is comprised of a carbon-based material and the first mask stack 304 is comprised of a material selected from the group consisting of silicon nitride, silicon oxide and amorphous or polycrystalline silicon. In a particular embodiment, the first mask stack 304 is comprised substantially of silicon nitride and the etch process used to form the sacrificial mask 310 utilizes gases selected from the group consisting of $CH_2F_2$ and $CHF_3$. In another particular embodiment, the first mask stack 304 is comprised substantially of silicon oxide and the etch process used to form the sacrificial mask 310 utilizes gases selected from the group consisting of $C_4F_8$ and $CHF_3$. In another particular embodiment, the first mask stack 304 is comprised substantially of amorphous or polycrystalline silicon and the etch process used to form the sacrificial mask 310 utilizes gases selected from the group consisting of $Cl_2$ and HBr. In accordance with an embodiment of the present invention, the thickness of the first mask stack 304 comprised of a single material is selected to optimize the subsequent formation of a spacer mask in a frequency doubling scheme. The thickness of the first mask stack 304 may be sufficiently small to prevent spacer mask line-collapse of a subsequently formed spacer mask and sufficiently large to enable critical dimension control of the spacer mask lines. In one embodiment, the thickness of the first mask stack 304 comprised of a single material is in the range of 4.06-5.625 times the targeted line width of the sacrificial mask 310.

In accordance with an alternative embodiment of the present invention, the first mask stack 304 is comprised of a first hardmask layer 304A above a first mask layer 304B, as indicated by the two layers depicted in FIG. 3A. Hence, the sacrificial mask 310 is comprised of a sacrificial hardmask portion 310A above a sacrificial mask portion 310B, as depicted in FIG. 3B. In one embodiment, the first hardmask layer 304A and the first mask layer 304B are patterned with the image of the patterned photoresist layer 302 in two distinct etch operations. The first hardmask layer 304A may be comprised of any material suitable for etching with an etch process that is substantially non-impactful to the patterned photoresist layer 302. In one embodiment, the dimensions and etch characteristics of the first hardmask layer 304A are selected to be amenable to a patterning process during which the patterned photoresist layer 302 is retained substantially intact. In a specific embodiment, the first mask layer 304B (which underlies the first hardmask layer 304A) is comprised of a material with etch characteristics similar to the etch characteristics of the patterned photoresist layer 302. Thus, the first hardmask layer 304A is used to preserve the image from the patterned photoresist layer 302 during the subsequent etch of the first mask layer 304B. In a specific embodiment, the patterned photoresist layer 302 and the first mask layer 304B are comprised of carbon-based materials and the first hardmask layer 304A is comprised of a material selected from the group consisting of silicon nitride, silicon oxide and amorphous or polycrystalline silicon. In a particular embodiment, the first hardmask layer 304A is comprised substantially of silicon nitride and the etch process used to pattern the first hardmask layer 304A selective to the patterned photoresist layer 302 and the first mask layer 304B utilizes gases selected from the group consisting of $CH_2F_2$ and $CHF_3$. In another particular embodiment, the first hardmask layer 304A is comprised substantially of silicon oxide and the etch process used to pattern the first hardmask layer 304A selective to the patterned photoresist layer 302 and the first mask layer 304B utilizes gases selected from the group consisting of $C_4F_8$ and $CHF_3$. In another particular embodiment, the first hardmask layer 304A is comprised substantially of amorphous or polycrystalline silicon and the etch process used to pattern the first hardmask layer 304A selective to the patterned photoresist layer 302 and the first mask layer 304B utilizes gases selected from the group consisting of $Cl_2$ and HBr. The thickness of the first hardmask layer 304A may be sufficiently small to enable highly selective etching relative to the patterned photoresist layer 302 and sufficiently large to avoid pinholes that may undesirably expose the first mask layer 304B. In one embodiment, the thickness of the first hardmask layer 304A is in the range of 20-50 nanometers.

In the case where the first mask stack 304 is comprised of a first hardmask layer 304A above a first mask layer 304B, the first mask layer 304B may be comprised of any material suitable to withstand a controlled etch process and a subsequent spacer mask formation process. In one embodiment, the first mask layer 304B has similar etch characteristics to the patterned photoresist layer 302. In a specific embodiment, the thicknesses of the patterned photoresist layer 302 and the first mask layer 304B are selected such that all portions of the patterned photoresist layer 302 remaining subsequent to the etch of the first hardmask layer 304A are removed during the etch of the first mask layer 304B. For example, in accordance with an embodiment of the present invention, both the patterned photoresist layer 302 and the first mask layer 304B are comprised substantially of carbon atoms. In one embodiment, the first mask layer 304B is comprised of a mixture of $sp^3$ (diamond-like)-, $sp^2$ (graphitic)- and $sp^1$ (pyrolitic)-hybridized carbon atoms formed from a chemical vapor deposition process using hydrocarbon precursor molecules. Such a film may be known in the art as an amorphous carbon film or Advanced Patterning Film™ (APF). In a specific embodiment, first mask layer 304B is comprised of such an amorphous carbon film and is etched by using gases selected from the group consisting of the combination of $O_2$ and $N_2$ or the combination of $CH_4$ and $N_2$ and $O_2$. In a particular embodiment, substantially all of the patterned photoresist layer 302 is removed in the same etch operation as that used to pattern the first mask layer 304B. The thickness of the first mask layer 304B may be sufficiently small to prevent spacer mask line-collapse of a subsequently formed spacer mask and sufficiently large to enable critical dimension control of the spacer mask lines. In one embodiment, the total thickness of the first mask stack 304 comprised of the first hardmask layer 304A and the first mask layer 304B is in the range of 4.06-5.625 times the targeted line width of the sacrificial mask 310.

Referring again to FIG. 3B, the first mask stack 304 (shown in FIG. 3A) is patterned to form the sacrificial mask 310 selective to the second mask stack 306. The second mask stack 306 is comprised of a second hardmask layer 306A above a second mask layer 306B, as depicted in FIG. 3B. The second hardmask layer 306A may have any properties suitable to protect the second mask layer 306B from the etch process used to form the sacrificial mask 310. In accordance with an embodiment of the present invention, the first mask stack 304 is comprised of a single material and is etched selective to the second hardmask layer 306A. In one embodiment, the first mask stack 304 is comprised of silicon nitride and the second hardmask layer 306A is comprised of a material selected from the group consisting of silicon oxide and amorphous or polycrystalline silicon. In another embodiment, the first mask stack 304 is comprised of silicon oxide and the second hardmask layer 306A is comprised of a material selected from the group consisting of silicon nitride and amorphous or polycrystalline silicon. In another embodiment, the first mask stack 304 is comprised of amorphous or polycrystalline silicon and the second hardmask layer 306A is comprised of a material selected from the group consisting of silicon nitride and silicon oxide. In accordance with an alternative embodiment of the present invention, the first mask stack 304 is comprised of a first hardmask layer 304A and a first mask layer 304B. In one embodiment, the first mask layer 304B is comprised of an amorphous carbon film etched by gases selected from the group consisting of the combination of $O_2$ and $N_2$ or the combination of $CH_4$ and $N_2$ and $O_2$ and the second hardmask layer 306A is comprised of a material selected from the group consisting of silicon nitride, silicon oxide and amorphous or polycrystalline silicon. The thickness of the second hardmask layer 306A may be sufficiently small to enable subsequent highly selective etching relative to the second mask layer 306B and sufficiently large to avoid pinholes that may undesirably expose the second mask layer 306B to the etch process applied to the first mask stack 304. In one embodiment, the thickness of the second hardmask layer 306A is in the range of 15-40 nanometers.

Figure 3C:
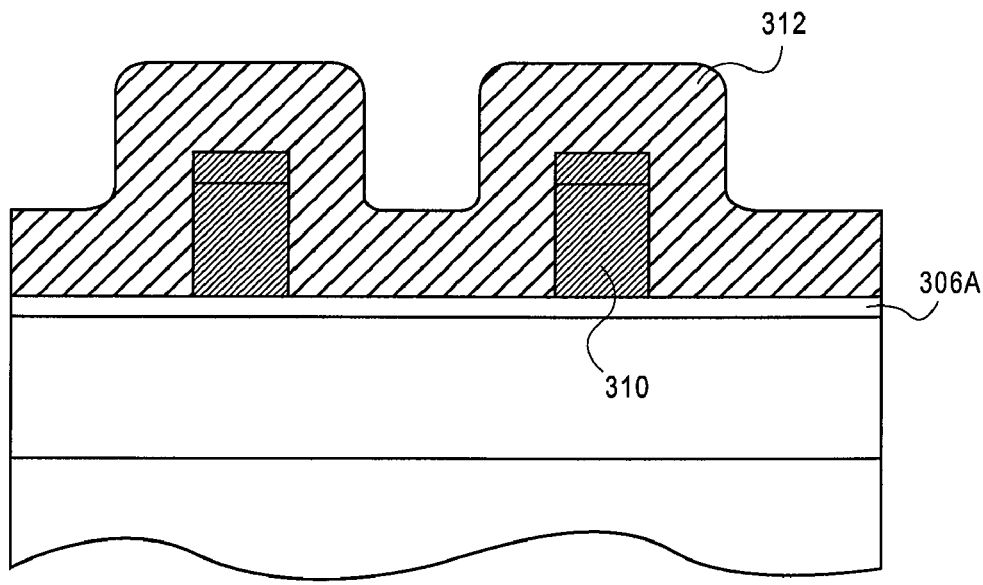

Referring to operation 208 of the flowchart 200 and corresponding FIG. 3C, a spacer layer 312 is deposited conformal over the sacrificial mask 310 and above the second hardmask layer 306A. The spacer layer 312 is the source of material for what will ultimately become a spacer mask for use in a frequency doubling scheme.

The spacer layer 312 may be comprised of any material suitable to form a reliable mask for use in a subsequent etch process. In accordance with an embodiment of the present invention, the spacer layer 312 is comprised of a material selected from the group consisting of silicon nitride, silicon oxide and amorphous or polycrystalline silicon. The spacer layer 312 may be deposited by any process suitable to provide a conformal layer on the sidewalls of the sacrificial mask 310, as depicted in FIG. 3C. In one embodiment, the spacer layer 312 is deposited by a chemical vapor deposition (CVD) technique selected from the group consisting of molecular-organic CVD, low-pressure CVD and plasma-enhanced CVD. The thickness of the spacer layer 312 may be selected to determine the width of the features in a subsequently formed spacer mask. Thus, in accordance with an embodiment of the present invention, the thickness of the spacer layer 312 is substantially the same as the width of the features of the sacrificial mask 310, as depicted in FIG. 3C. Although for a frequency doubling scheme the ideal thickness of the spacer layer 312 is the same as the width of the features of the sacrificial mask 310, the initial targeted width may be required to be slightly thicker to compensate for the etch process used to pattern the spacer layer 312. In one embodiment, the thickness of the spacer layer 312 is approximately 1.06 times the width of the features of the sacrificial mask 310, i.e. 1.06 times the desired feature width of the lines in a subsequently formed spacer mask.

Figure 3D:
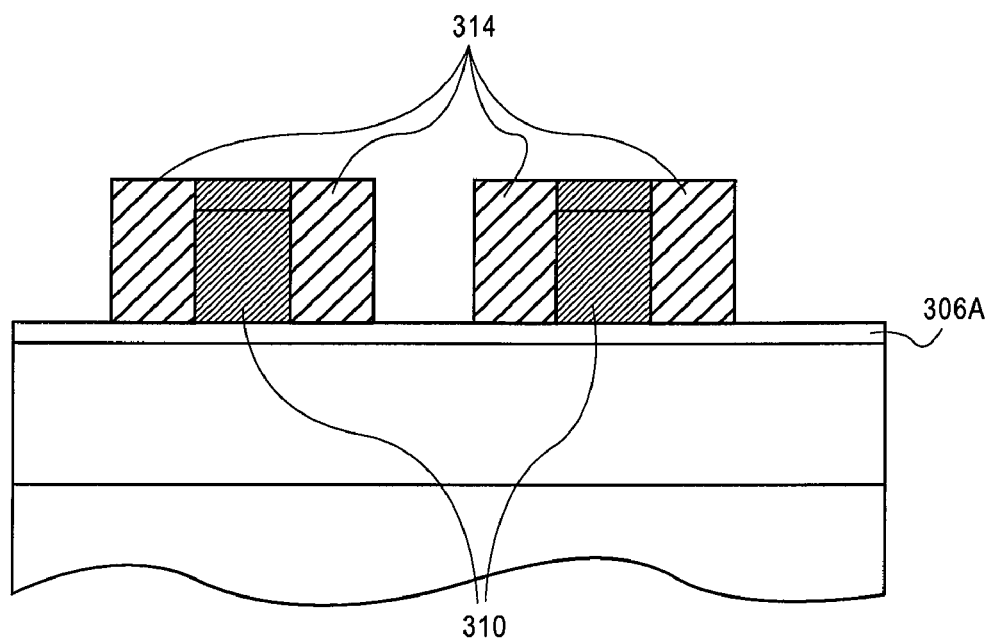

Referring again to operation 208 of the flowchart 200 and now to corresponding FIG. 3D, the spacer layer 312 is etched to provide the spacer mask 314 and to expose the top surfaces of the sacrificial mask 310 and the second hardmask layer 306A. The lines of the spacer mask 314 are conformal with the sidewalls of the features of the sacrificial mask 310. Thus, there are two lines from the spacer mask 314 for every line of the sacrificial mask 310, as depicted in FIG. 3D.

The spacer layer 312 may be etched by any process suitable to provide well-controlled dimensions, for instance, to maintain a width of critical dimension of the sacrificial mask 310. In accordance with an embodiment of the present invention, the spacer layer 312 is etched until the lines of the spacer mask 314 are substantially the same height as the features of the sacrificial mask 310, as depicted in FIG. 3D. In another embodiment, the lines of the spacer mask 314 are recessed slightly below the top surface of the features of the sacrificial mask 310 in order to ensure that the continuity of the spacer layer 312 is broken above and between the lines of the spacer mask 314. The spacer layer 312 may be etched such that the spacer lines of the spacer mask 314 retain a substantial portion of the original thickness of the spacer layer 312. In a particular embodiment, the width of the top surface of each line of the spacer mask 314 is substantially the same as the width at the interface of the spacer mask 314 and the second hardmask layer 306A, as depicted in FIG. 3D.

The spacer layer 312 may also be etched to form the spacer mask 314 (e.g., FIG. 3D) with high etch selectivity to the sacrificial mask 310 and the second hardmask layer 306A. In a particular embodiment, the sacrificial mask 310 is a single layer mask and the desired etch selectivity is with respect to the single layer. In another particular embodiment, the sacrificial mask 310 is a stacked layer and the desired etch selectivity is with respect to a sacrificial hardmask portion, or with respect to the material of the first hardmask layer 304A. In accordance with an embodiment of the present invention, the spacer layer 312 and the spacer mask 314 is comprised of a material different than the materials of the top portion of the sacrificial mask 310 and the second hardmask layer 306A. In one embodiment, the top portion of the sacrificial mask 310 is comprised of silicon nitride, the second hardmask layer 306A is comprised of silicon oxide and the spacer layer 312 is comprised of amorphous or polycrystalline silicon and is etched to form the spacer mask 314 with a dry etch process using a plasma generated from the gases $Cl_2$ or HBr. In another embodiment, the top portion of the sacrificial mask 310 is comprised of silicon oxide, the second hardmask layer 306A is comprised of silicon nitride and the spacer layer 312 is comprised of amorphous or polycrystalline silicon and is etched to form the spacer mask 314 with a dry etch process using a plasma generated from the combination of the gases $Cl_2$ and HBr. In another embodiment, the top portion of the sacrificial mask 310 is comprised of amorphous or polycrystalline silicon, the second hardmask layer 306A is comprised of silicon nitride and the spacer layer 312 is comprised of silicon oxide and is etched to form the spacer mask 314 with a dry etch process using a plasma generated from the gas $C_4F_8$. In another embodiment, the top portion of the sacrificial mask 310 is comprised of amorphous or polycrystalline silicon, the second hardmask layer 306A is comprised of silicon oxide and the spacer layer 312 is comprised of silicon nitride and is etched to form the spacer mask 314 with a dry etch process using a plasma generated from the gas $CH_2F_2$. In another embodiment, the top portion of the sacrificial mask 310 is comprised of silicon oxide, the second hardmask layer 306A is comprised of amorphous or polycrystalline silicon and the spacer layer 312 is comprised of silicon nitride and is etched to form the spacer mask 314 with a dry etch process using a plasma generated from the combination of the gases $CHF_3$ and $CH_2F_2$. In another embodiment, the top portion of the sacrificial mask 310 is comprised of silicon nitride, the second hardmask layer 306A is comprised of amorphous or polycrystalline silicon and the spacer layer 312 is comprised of silicon oxide and is etched to form the spacer mask 314 with a dry etch process using a plasma generated from the gas CHF$_3$. In a specific embodiment of the present invention, the etch process used to form the spacer mask 314 is end-pointed upon exposure of the top surfaces of the sacrificial mask 310 and the second hardmask layer 306A. In a particular embodiment, a slight over-etch is applied following the end-point detection to ensure that the lines of the spacer mask 314 are discontinuous from feature to feature (e.g. line-to-line) of the sacrificial mask 310.

Figure 3E:
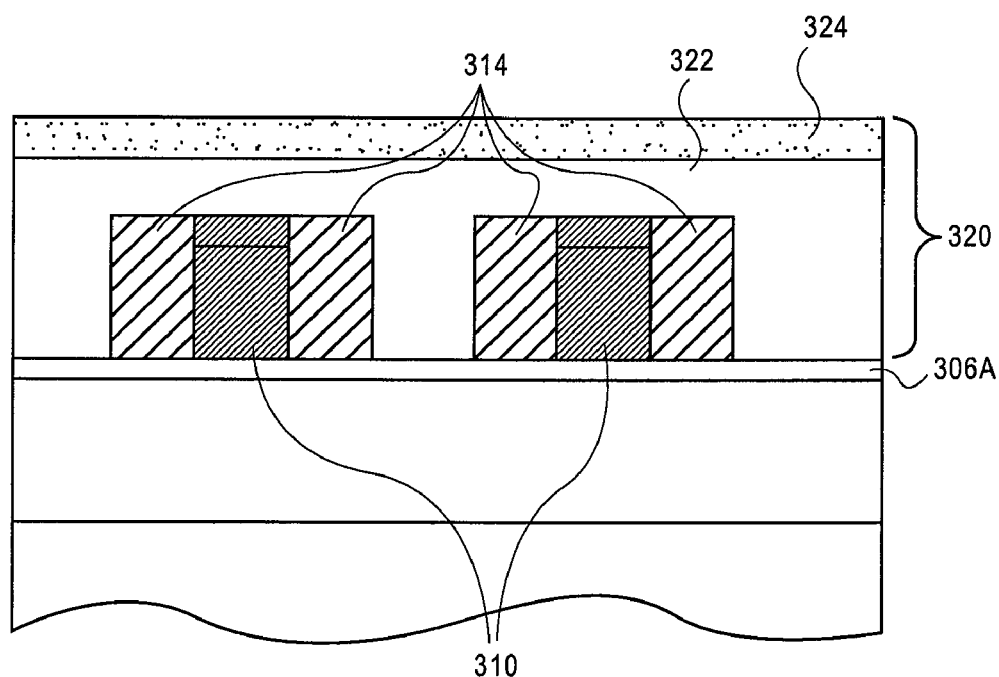
Figure 3E:
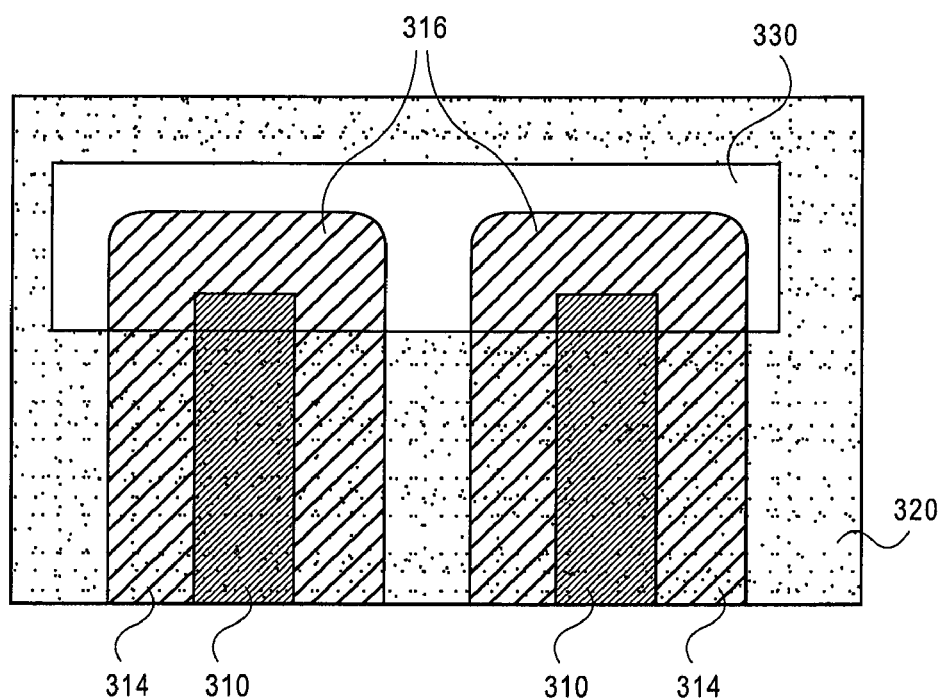

Referring to operation 210 of the flowchart 200 and corresponding FIGS. 3E and 3E', a photoresist stack 320 is deposited above the spacer mask 314 and the exposed portions of the sacrificial mask 310 and the second hardmask layer 306A. In the present embodiment, the photoresist stack 320 is typically deposited before the spacer mask 314. In certain embodiments, the spacer lines from the spacer mask 314 were made discontinuous between neighboring lines of the sacrificial mask 310 such as those described in FIG. 3D. However, spacer lines of the spacer mask 314 associated with the same line from the sacrificial mask 310 remain continuous around the ends of each of the lines of the sacrificial mask 310, as depicted by end-portions 316 of the spacer mask 314 illustrated in the top-down view of FIG. 3E'. It may be desirable to break this continuity between pairs of spacer lines for subsequent semiconductor device manufacture. Thus, in accordance with an embodiment of the present invention, the end-portions 316 are exposed by the window 330 upon patterning the photoresist stack 320, as depicted in FIG. 3E'.

Returning to FIG. 3E, a photoresist stack 320 may have a photoresist layer 324 comprised of any material described in association with the patterned photoresist layer 302 from FIG. 3A. Additionally, the photoresist stack 320 may comprise a bottom-anti-reflective-coating (BARC) layer 322 in between the photoresist layer 324 and the spacer mask 314 in order to provide a flat surface for the photoresist layer 324, as depicted in FIG. 3E. In one embodiment, the lithographic process used to pattern the photoresist stack 320 incorporates exposure and development of a photoresist layer 324 having a substantially flat bottom surface. In a specific embodiment, the BARC layer is a spin-on glass material having an organic group. In an alternative embodiment, the photoresist stack 320 is comprised entirely of a photoresist layer.

The photoresist stack 320 may be deposited by any process that provides a flat top surface for the photoresist stack 320. For example, in accordance with an embodiment of the present invention, the photoresist stack 320 comprises the photoresist layer 324 above the BARC layer 322 and both the photoresist layer 324 and the BARC layer 322 are deposited by a spin-on process. In another embodiment, the photoresist stack 320 substantially comprises a photoresist layer which is deposited by a spin-on process. The spin-on process used to deposit the BARC layer 322 or a photoresist layer (in the case that the photoresist stack 320 does not comprise a BARC layer) may generate enough force to topple a thin feature or line in a spacer mask. For example, the spin-on process may generate enough force to topple a stand-alone line from the spacer mask 314. Thus, in accordance with an embodiment of the present invention, the sacrificial mask 310 is retained throughout the spacer cropping process in order to provide structural support to the individual spacer lines from the spacer mask 314. In a particular embodiment, by retaining the sacrificial mask 310, no spacer lines from the spacer mask 314 are toppled in the spin-on process used to deposit the photoresist stack 320.

The photoresist stack 320 may be patterned by any lithographic process described in association with the patterning of the patterned photoresist layer 302 from FIG. 3A. In one embodiment, the photoresist stack 320 is patterned to form a window 330 that exposes the end-portions 316 of the spacer mask 314. The size of the window 330 may be any dimension suitable to crop the spacer mask 314. The region 330 may expose at least the entire end-portions 316 of the spacer mask 314. In accordance with an embodiment of the present invention, the dimensions of the window 330 are selected to also expose a portion of the sacrificial mask 310. Thus, in one embodiment, the dimensions and positioning of the window 330 in the photoresist stack 320 are selected to accommodate for any slight offset in the patterning and, hence, cropping process.

Figure 3F:
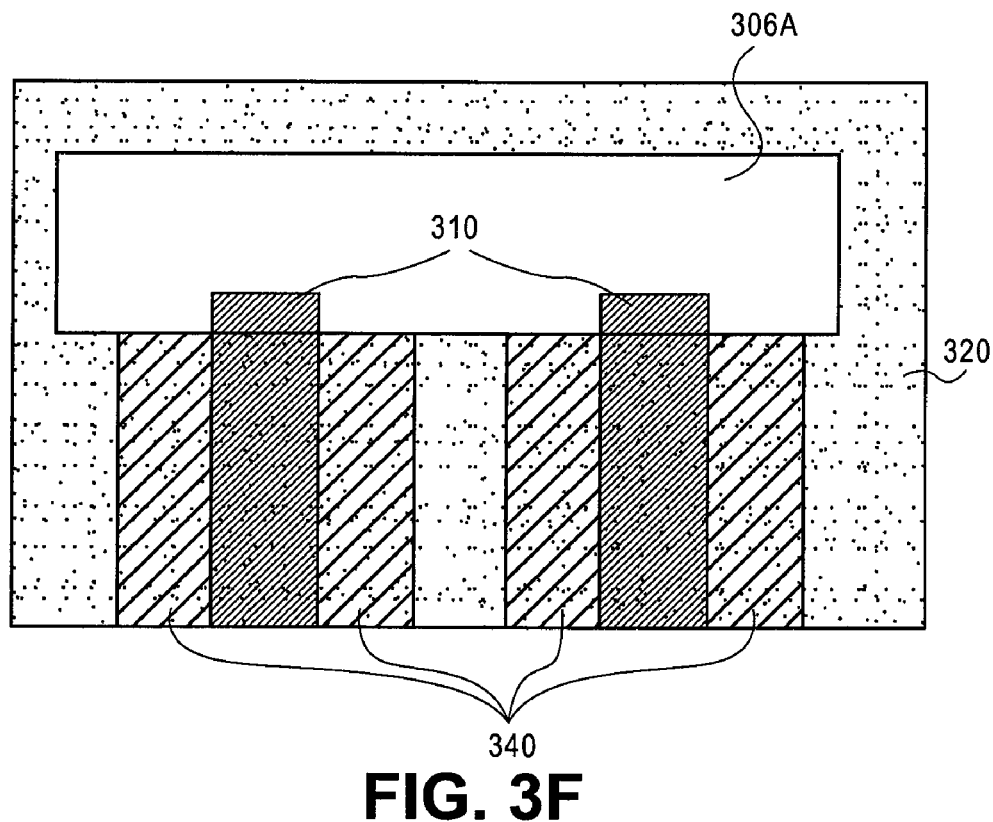

Referring to operation 212 of the flowchart 200 and corresponding top-down FIG. 3E', the spacer mask 314 is cropped to form a cropped spacer mask 340. The spacer mask 314 may be cropped by any etch process that removes the exposed portions of the spacer mask 314. As illustrated, the end-portions 316, selective to the photoresist stack 320 and the second hardmask layer 306A are removed. It is not necessary that the etch be selective to the exposed portions of the sacrificial mask 310. However, in accordance with an embodiment, the cropping etch process is selective to the exposed portions of the sacrificial mask 310, as depicted in FIG. 3F. Thus, any material and etch process combination described for the etching of the spacer layer 312 in association with FIGS. 3C and 3D may be used to form the cropped spacer mask 340.

Figure 3G:
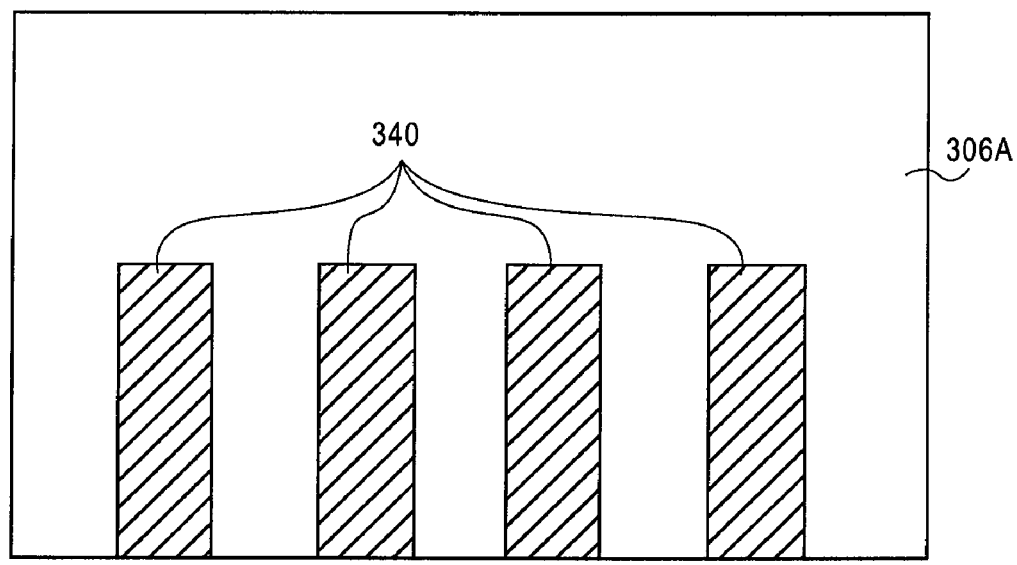
Figure 3G:
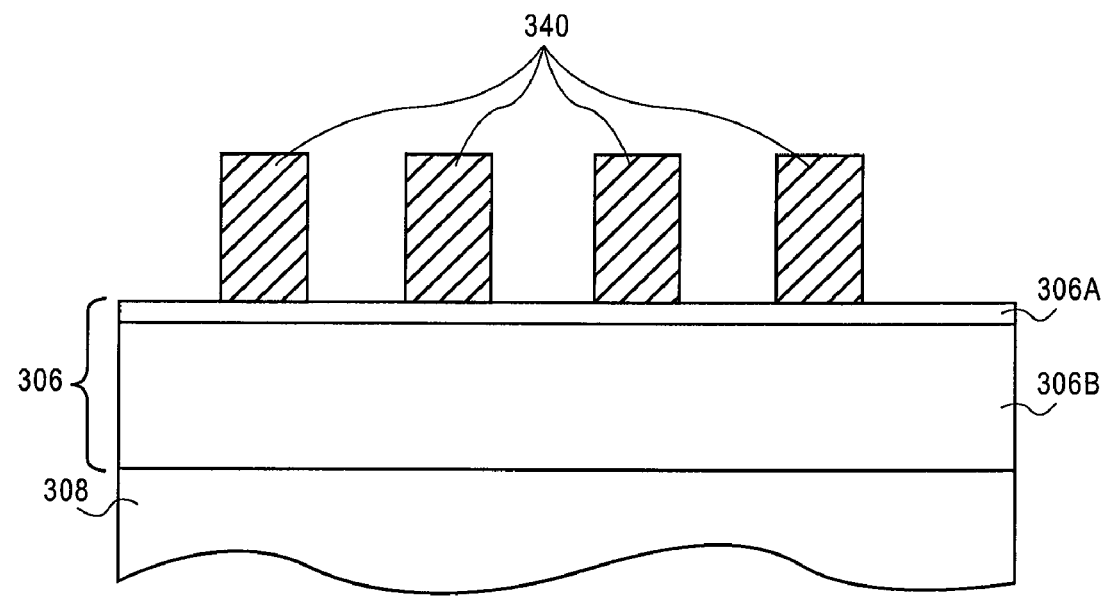

Referring to operation 214 of the flowchart 200 and corresponding FIGS. 3G and 3G', the photoresist stack 320 and the sacrificial mask 310 are removed. Thus, in accordance with an embodiment of the present invention, the sacrificial mask 310 is retained to provide structural support through the cropping of the spacer mask 314 to form the cropped spacer mask 340. However, once the cropped spacer mask is formed, the sacrificial mask 310 may be removed to complete the frequency doubling mask fabrication process.

The photoresist stack 320 may be removed in the same process operation as the removal of the sacrificial mask 310 or in a preceding process operation. In one embodiment, the photoresist stack is comprised of carbon-containing species and is removed in a preceding wet or dry ash operation utilizing the gases O$_2$ and N$_2$. The sacrificial mask 310 may be removed by any technique that is highly selective to the cropped spacer mask 340 and the second hardmask layer 306A. In accordance with an embodiment of the present invention, the sacrificial mask 310 is comprised of a single layer and is removed selective to the cropped spacer mask 340 in a single process operation. In one embodiment, the cropped spacer mask 340 is comprised of amorphous or polycrystalline silicon, the second hardmask layer 306A is comprised of silicon oxide and the sacrificial mask 310 is comprised substantially of silicon nitride and is removed by a single etch operation selected from the group consisting of a hot H$_3$PO$_4$ wet etch or a SiCoNi etch. In another embodiment, the cropped spacer mask 340 is comprised of amorphous or polycrystalline silicon, the second hardmask layer 306A is comprised of silicon nitride and the sacrificial mask 310 is comprised substantially of silicon oxide and is removed by a single etch operation selected from the group consisting of an aqueous hydrofluoric acid wet etch or a SiCoNi etch. In another embodiment, the cropped spacer mask 340 is comprised of silicon oxide, the second hardmask layer 306A is comprised of silicon nitride and the sacrificial mask 310 is comprised substantially of amorphous or polycrystalline silicon and is removed by a single etch operation selected from the group consisting of a Cl$_2$ plasma etch and a CF$_4$/O$_2$ plasma etch. In another embodiment, the cropped spacer mask 340 is comprised of silicon nitride, the second hardmask layer 306A is comprised of silicon oxide and the sacrificial mask 310 is comprised substantially of amorphous or polycrystalline silicon and is removed by a single etch operation selected from the group consisting of a $Cl_2$ plasma etch and a $CF_4/O_2$ plasma etch. In another embodiment, the cropped spacer mask 340 is comprised of silicon nitride, the second hardmask layer 306A is comprised of amorphous or polycrystalline silicon and the sacrificial mask 310 is comprised substantially of silicon oxide and is removed by a single etch operation selected from the group consisting of an aqueous hydrofluoric acid wet etch or a SiCoNi etch. In another embodiment, the cropped spacer mask 340 is comprised of silicon oxide, the second hardmask layer 306A is comprised of amorphous or polycrystalline silicon and the sacrificial mask 310 is comprised substantially of silicon nitride and is removed by a single etch operation selected from the group consisting of a hot $H_3PO_4$ wet etch or a SiCoNi etch.

In an alternative embodiment, the sacrificial mask 310 is comprised of a sacrificial hardmask portion above a sacrificial mask portion, as described in an alternative embodiment associated with FIG. 3B. For example, in one embodiment, the sacrificial hardmask portion is comprised of a material selected from the group consisting of silicon nitride, silicon oxide and amorphous or polycrystalline silicon, while the sacrificial mask portion is comprised of an amorphous carbon material, such as the amorphous carbon material described in association with the first mask layer 304B. Thus, in accordance with an embodiment of the present invention, the same material combinations and etch processes embodied above for removing the sacrificial mask 310 selective to the cropped spacer mask 340 and the second hardmask layer 306A are used to remove a sacrificial hardmask portion selective to the cropped spacer mask 340 and the second hardmask layer 306A. The sacrificial mask portion underlying the sacrificial hardmask portion of a stacked sacrificial mask may be substantially removed in the same etch operation that is used to remove the sacrificial hardmask portion. Alternatively, a second etch operation may be required to remove the sacrificial mask portion. In one embodiment, the sacrificial mask portion is comprised of amorphous carbon and is removed with a dry etch having a plasma comprised of gases selected from the group consisting of the combination of $O_2$ and $N_2$ or the combination of $CH_4$, $N_2$ and $O_2$.

Figure 3H:
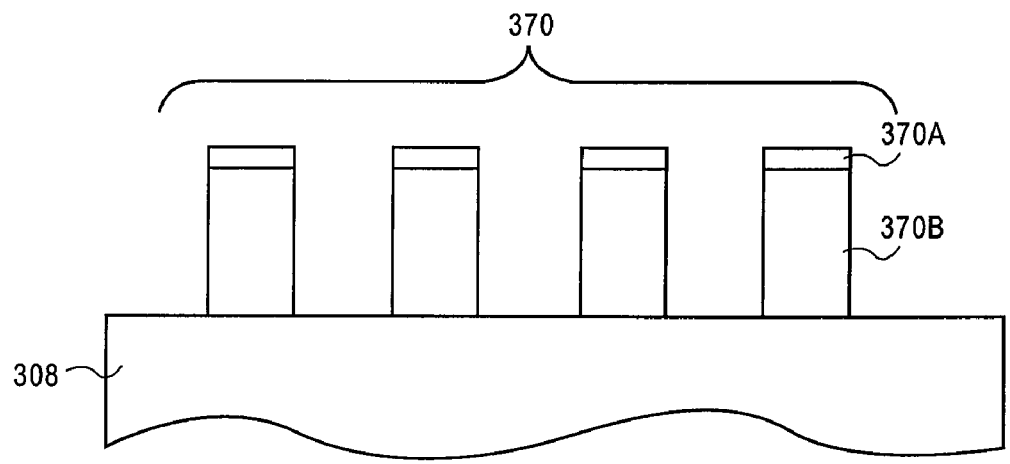

Referring to operation 216 of the flowchart 200 and corresponding FIG. 3H, the image of the cropped spacer mask 340 is transferred to the second mask stack 306 to form the etch mask 370 above the semiconductor layer 308. In one embodiment, the second mask stack 306 is comprised substantially of a single material and is etched to form the etch mask 370 in a single etch operation. In a specific embodiment, the second mask stack 306 is comprised substantially of a single material selected from the group consisting of silicon nitride, silicon oxide and amorphous or polycrystalline silicon. In an alternative embodiment, the second mask stack 306 is comprised of the second hardmask layer 306A above the second mask layer 306B, as depicted in and described in association with FIG. 3B. In one embodiment, the etch mask 370 is comprised of a hardmask portion 370A and a mask portion 370B, as depicted in FIG. 3H. Embodiments for the material composition and thickness of the second hardmask layer 306A and, hence, the hardmask portion 370A were described in association with FIG. 3B. In accordance with an embodiment of the present invention, the image of the cropped spacer mask 340 is transferred into the second hardmask layer 306A in an etch operation distinct from the patterning operation ultimately used to form the mask portion 370B. In one embodiment, the second hardmask layer 306A is comprised substantially of amorphous or polycrystalline silicon and is etched to form the hardmask portion 370A with a dry etch using the gas $CHF_3$. In another embodiment, the second hardmask layer 306A is comprised substantially of silicon oxide and is etched to form the hardmask portion 370A with a dry etch using gases selected from the group consisting of $CH_2F_2$ and the combination of $Cl_2$ and HBr. In another embodiment, the second hardmask layer 306A is comprised substantially of silicon nitride and is etched to form the hardmask portion 370A with a dry etch using gases selected from the group consisting of $C_4F_8$, $Cl_2$ and HBr.

In accordance with an embodiment of the present invention, the image of the cropped spacer mask 340 is then transferred from the hardmask portion 370A to a mask portion 370B in a second etch operation. The second mask layer 306B and, hence, the mask portion 370B of the etch mask 370 may be comprised of any material suitable for substantially withstanding an etch process used to subsequently pattern the semiconductor layer 308. In one embodiment, the second mask layer 306B is comprised of an amorphous carbon material, such as the amorphous carbon material described in association with an embodiment of the composition of the first mask layer 304B. In a particular embodiment, the thickness of the second mask layer 306B and, hence, the mask portion 370B of the etch mask 370 is in the range of 3.125-6.875 times the width of each of the lines of the etch mask 370. The second mask layer 306B may be etched to form the mask portion 370B by any etch process that maintains a substantially vertical profile for each of the lines of the etch mask 370, as depicted in FIG. 3H. In one embodiment, the second mask layer 306B is comprised of amorphous carbon and is removed with a dry etch process using a plasma comprised of gases selected from the group consisting of the combination of $O_2$ and $N_2$ or the combination of $CH_4$, $N_2$ and $O_2$.

Through various embodiments, one or more methods to fabricate an etch mask 370 comprised of lines that double the frequency of the lines from a sacrificial mask have been described. The etch mask 370 may then be used to pattern a semiconductor layer 308 for, e.g. device fabrication for an integrated circuit. In accordance with an embodiment of the present invention, the etch mask 370 has a mask portion 370B comprised substantially of an amorphous carbon material. During an etch process used to pattern the semiconductor layer 308, the amorphous carbon material becomes passivated and is thus able to retain its image and dimensionality throughout the entire etch of the semiconductor layer 308. Although the spacer mask 340 has the desired dimensions for the patterning semiconductor layer 308, the material of the spacer mask 340 may not be suitable to withstand a precise image transfer to a semiconductor layer, i.e. it may degrade during the etch process. In accordance with an embodiment of the present invention, the image of a cropped spacer mask is first transferred to a layer comprising an amorphous carbon material prior to transferring the image to a semiconductor layer, as described in association with FIGS. 3G and 3H.

The semiconductor layer 308 may be any layer desirable for device fabrication or any other semiconductor structure fabrication requiring a double frequency mask. For example, in accordance with an embodiment of the present invention, the semiconductor layer 308 comprises any material that can be suitably patterned into an array of distinctly defined semiconductor structures. In one embodiment, the semiconductor layer 308 is comprised of a group IV-based material or a III-V material. Additionally, the semiconductor layer 308 may comprise any morphology that can suitably be patterned into an array of distinctly defined semiconductor structures. In an embodiment, the morphology of the semiconductor layer 308 is selected from the group consisting of amorphous, mono-crystalline and poly-crystalline. In one embodiment, the semiconductor layer 308 comprises charge-carrier dopant impurity atoms. The semiconductor layer 308 may further reside above a substrate. The substrate may be comprised of any material suitable to withstand a fabrication process. In an embodiment, the substrate is comprised of a flexible plastic sheet. The substrate may further be comprised of a material suitable to withstand a manufacturing process and upon which semiconductor layers may suitably reside. In an embodiment, the substrate is comprised of group IV-based materials such as crystalline silicon, germanium or silicon/germanium. In another embodiment, the substrate is comprised of a III-V material. The substrate may also comprise an insulating layer. In one embodiment, the insulating layer is comprised of a material selected from the group consisting of silicon oxide, silicon nitride, silicon oxy-nitride and a high-k dielectric layer.

Figure 4A:
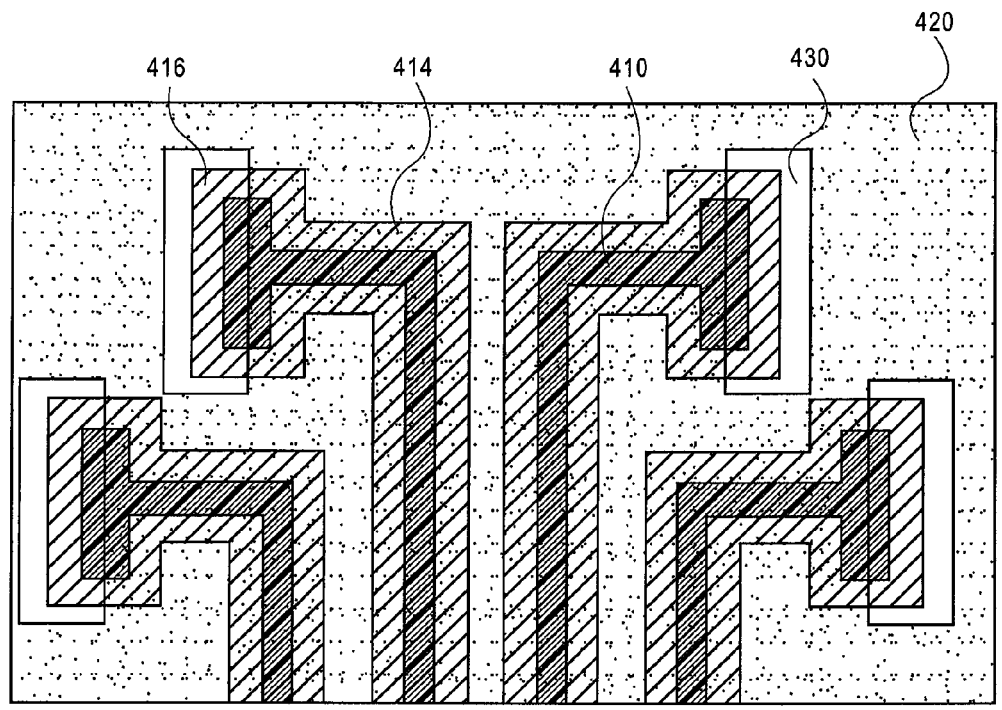
FIGS. 4A-B illustrate top-down views of an exemplary method of a spacer mask fabrication process, in accordance with an embodiment of the present invention.
Figure 4B:
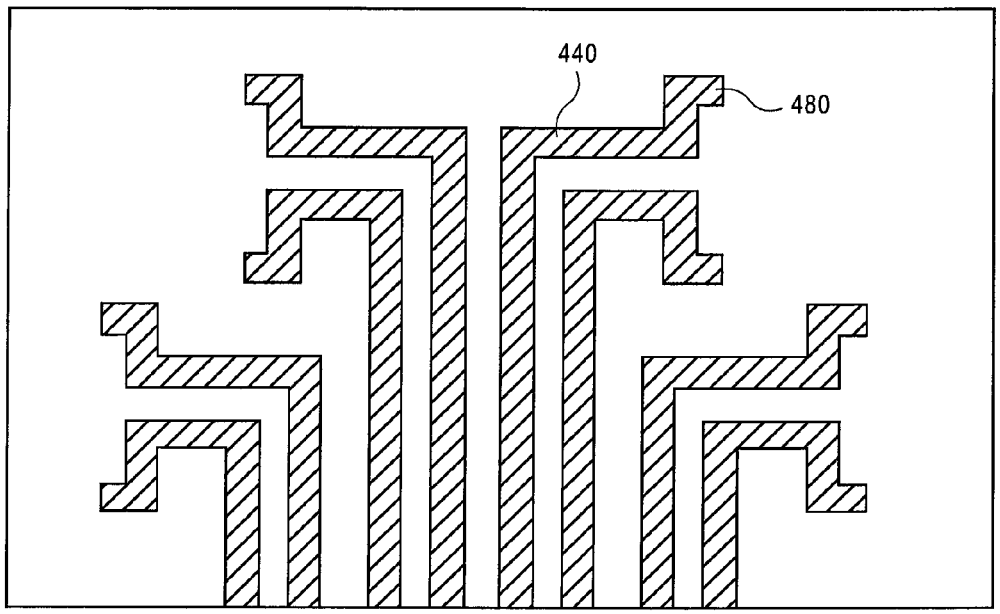

It is to be appreciated that embodiments of the present invention are not limited to the fabrication of a spacer mask that is cropped at regions surrounding the ends of the lines in a sacrificial mask. In accordance with another embodiment of the present invention, portions of a spacer mask that surround structures other than line-ends are cropped in the presence of a structurally supportive sacrificial mask. FIGS. 4A-B illustrate top-down views representing processes in a spacer mask fabrication process, in accordance with an embodiment of the present invention.

Referring to FIG. 4A, a patterned photoresist layer 420 is formed above a spacer mask 414 and a sacrificial mask 410. The end regions 416 of the spacer mask 414, which surround non-linear features from the sacrificial mask 410, are exposed by the windows 430 in the patterned photoresist layer 420. This top-down illustration corresponds with FIG. 3E' and may represent a different region of the spacer mask 314 than the line-ends depicted in FIG. 3E'. Referring to FIG. 4B, the spacer mask 414 is cropped to form the cropped spacer mask 440. Additionally, the patterned photoresist layer 420 and the sacrificial mask 410 are removed. In accordance with an embodiment of the present invention, the sacrificial mask 410 is retained for structural support while non-linear portions of the spacer mask 414 are cropped. This process enables the formation of a cropped spacer mask 440 with the spacer ends 480 separated by a distance greater than the spacing of the lines of the cropped spacer mask 440, as depicted in FIG. 4B. In one embodiment, subsequent contact formation to each of the spacer ends 480 is facilitated without danger of inadvertently contacting more than one spacer line from the cropped spacer mask 440 with a single contact.

In forming a spacer mask, it may be desirable to retain more than just the portion of a spacer layer that is conformal to the sidewalls of a sacrificial mask. Area preservation regions may be retained during the formation of a spacer mask. Such area preservation regions may be used to form contact landing pads, lines of varying dimension or lines running in two directions which cannot otherwise be formed from a spacer deposited along the perimeter of a sacrificial core, such as at a T-intersection. FIGS. 5A-D illustrate cross-sectional views representing a series of operations in a spacer mask fabrication method including an area-preservation operation, in accordance with an embodiment of the present invention.

Figure 5A:
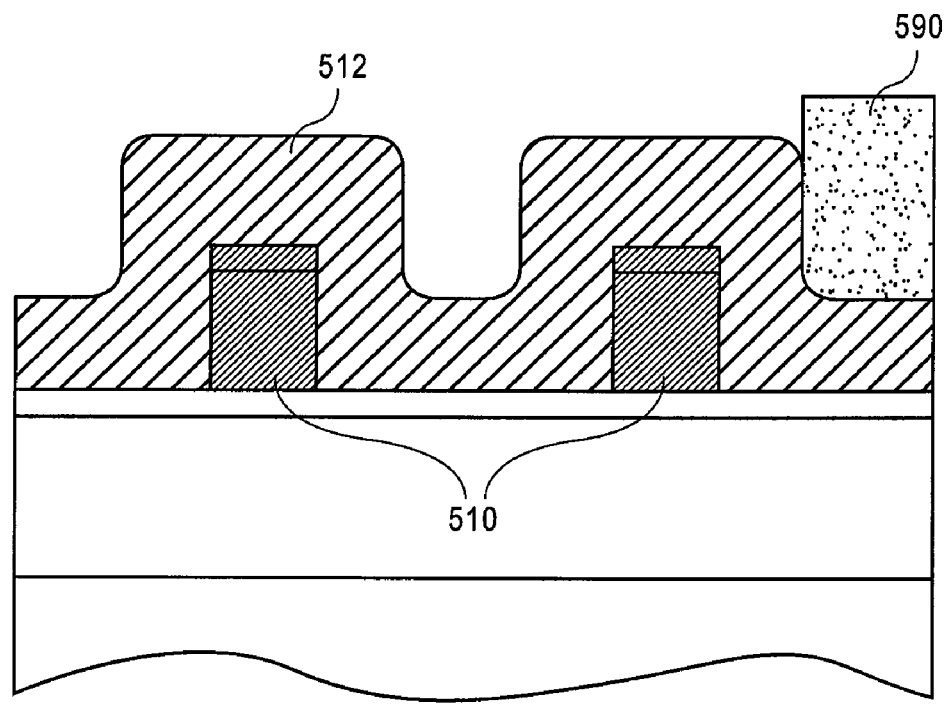
FIGS. 5A-D illustrate cross-sectional views of an exemplary method of a spacer mask fabrication process, in accordance with an embodiment of the present invention.

Referring to FIG. 5A, a spacer layer 512 is deposited conformal with a sacrificial mask 510. The spacer layer 512 is the source of material for what will ultimately become a spacer mask for use in a frequency doubling scheme incorporating an area-preservation operation. FIG. 5A corresponds with FIG. 3C described above. Prior to the etch process used to pattern the spacer layer 512 to form a spacer mask, a photoresist layer 590 is deposited and patterned above the spacer layer 512. In accordance with an embodiment of the present invention, the photoresist layer 590 is patterned in order to retain a portion of the spacer layer 512 that would otherwise be removed in a spacer mask formation etch operation. In one embodiment, the spacer layer 512 provides structural support for the sacrificial mask 510 during the deposition and patterning of the photoresist layer 590. The photoresist layer 590 may be comprised of any material and may be patterned by any technique as described in association with the photoresist stack 320 from FIGS. 3E and 3E'.

Figure 5B:
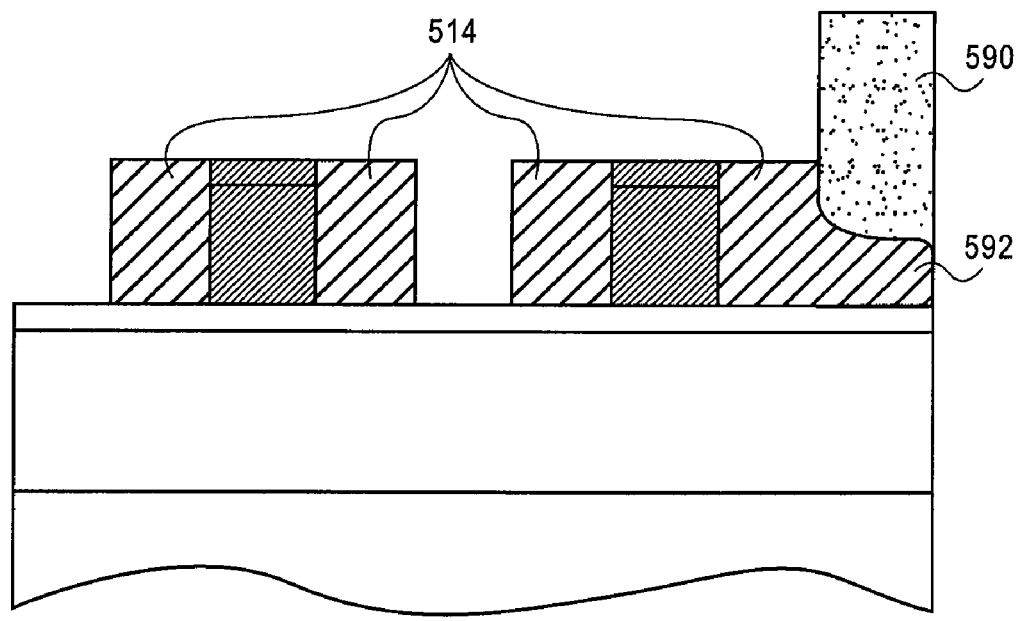
Figure 5C:
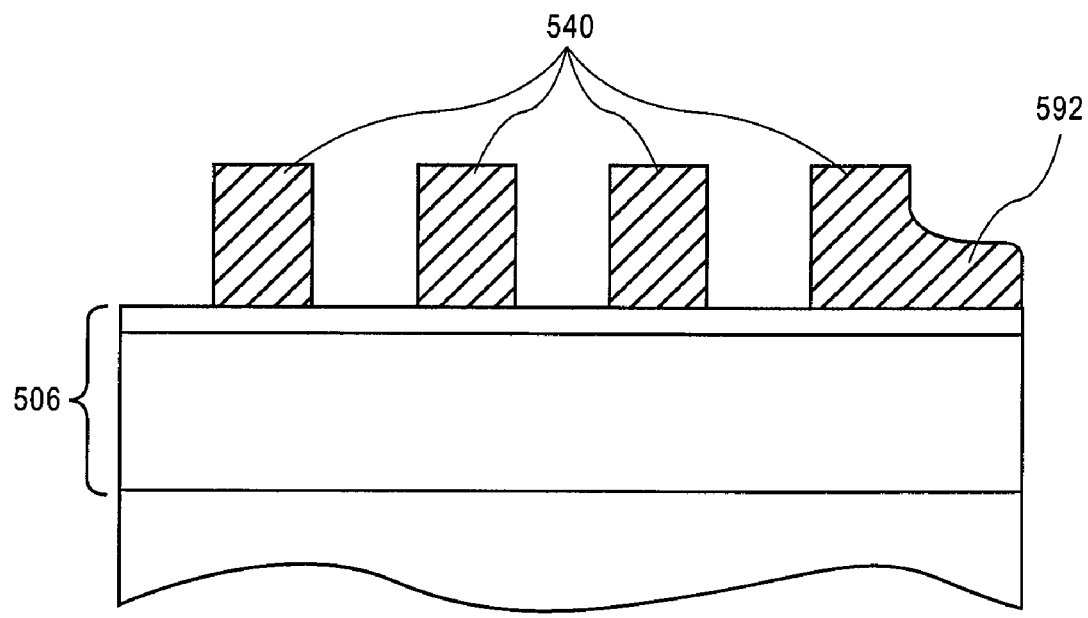
Figure 5D:
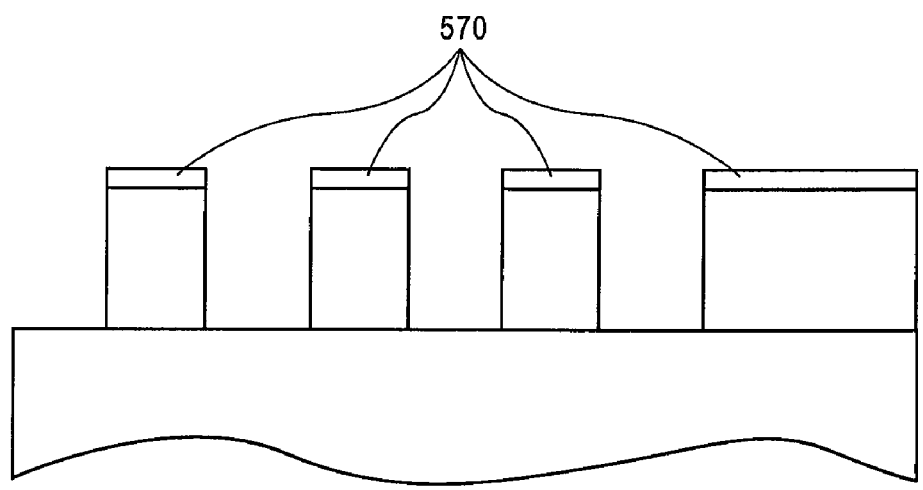

Referring to FIG. 5B, the spacer layer 512 is etched to form the spacer mask 514. The spacer mask 514 includes an area-preservation portion 592 that is retained because of protection by the photoresist layer 590. The photoresist layer 590 is then removed and the spacer mask 514 is cropped in a cropping process sequence that includes retention of the sacrificial mask 510 through the cropping process. Furthermore, in accordance with an embodiment of the present invention, the area-preservation portion 592 is also retained throughout the cropping process. Referring to FIG. 5C, the sacrificial mask 510 is removed, leaving only the cropped spacer mask 540 having the area-preservation portion 592. Referring to FIG. 5D, the image of the cropped spacer mask 540 having the area-preservation portion 592 is transferred to a second mask stack 506 to form an etch mask 570. In accordance with an embodiment of the present invention, as a result of the area-preservation process, the etch mask 570 comprises at least one feature having a width greater than the width of the thinnest lines in etch mask 570, as depicted in FIG. 5D. The ordering of the cropping process and the area-preservation process may not be sequence-dependent. In accordance with an alternative embodiment of the present invention, the cropping process is carried out prior to the area-preservation process.

Figure 6A:
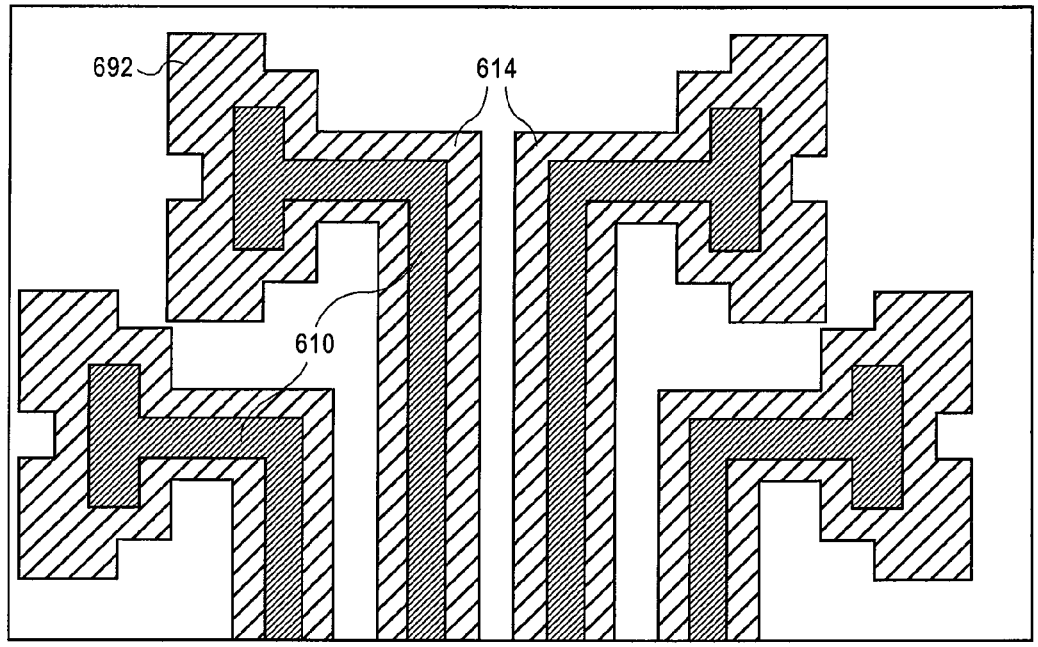
FIGS. 6A-B illustrate top-down views of an exemplary method of a spacer mask fabrication process, in accordance with an embodiment of the present invention.
Figure 6B:
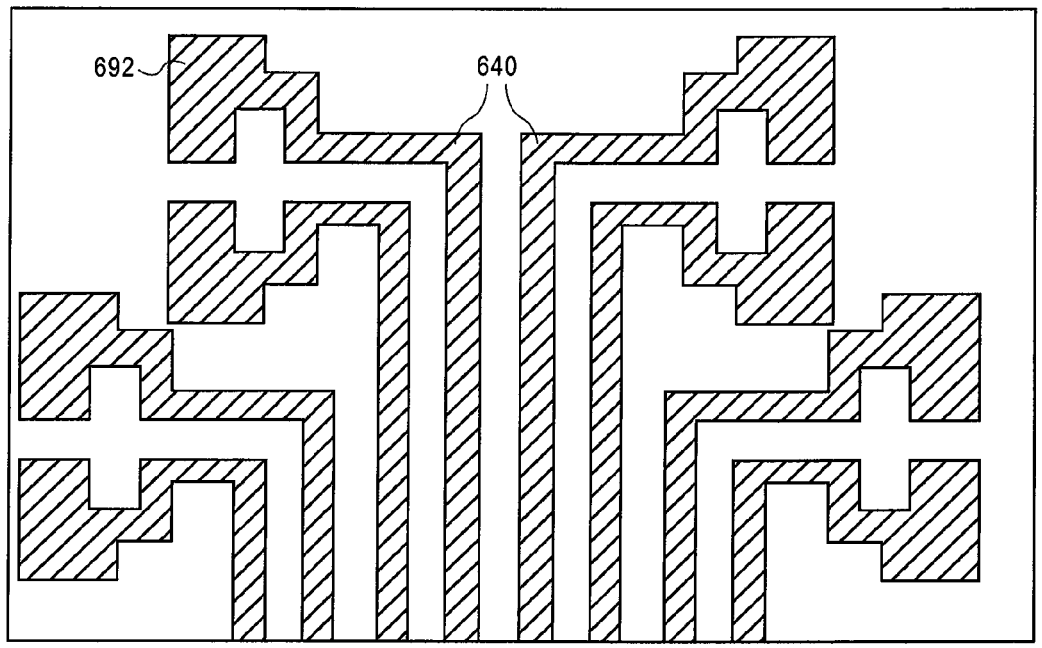

An area-preservation process may be used in conjunction with a spacer mask process to ultimately form regions in a semiconductor layer that may be used for forming contacts. FIGS. 6A-B illustrate top-down views representing operations in a spacer mask fabrication method incorporating an area-preservation process, in accordance with an embodiment of the present invention.

Referring to FIG. 6A, a spacer mask 614 having area-preservation regions 692 is formed around a sacrificial mask 610, as described in association with FIG. 5B. Referring to FIG. 6B, the spacer mask 614 is cropped to form the cropped spacer mask 640 having the area-preservation regions 692 and then the sacrificial mask 610 is removed. The area-preservation regions 692 may provide a larger region onto which contacts may be formed. In accordance with an embodiment of the present invention, a portion of a spacer layer that would otherwise be removed in a spacer mask formation etch operation is retained in an area-preservation operation.

Methods for fabricating a semiconductor mask have been disclosed. In an embodiment, a semiconductor stack having a sacrificial mask and a spacer mask is provided. The sacrificial mask is comprised of a series of lines and the spacer mask has spacer lines adjacent to the sidewalls of the series of lines. The sacrificial mask is removed subsequent to cropping the spacer mask to provide a cropped spacer mask. In one embodiment, the spacer mask is formed by depositing a spacer layer above the semiconductor stack and conformal with the sacrificial mask. The spacer layer is etched to provide the spacer mask having spacer lines adjacent to the sidewalls of the series of lines of the sacrificial mask and to expose the top surface of the sacrificial mask. A photoresist layer is then deposited and patterned above the spacer mask and the sacrificial mask to expose a portion of the spacer mask. The exposed portion of the spacer mask is etched to crop the spacer mask. Finally, the sacrificial mask is removed to provide only the cropped spacer mask. In a particular embodiment, the cropped spacer mask doubles the frequency of the series of lines of the sacrificial mask.

What is claimed is:

1. A method for fabricating a semiconductor mask, comprising:
providing a semiconductor stack having a sacrificial mask comprised of a series of lines, each line of said series of lines having sidewalls and ends;
depositing a spacer layer above said semiconductor stack and conformal with said sacrificial mask;
etching said spacer layer, the etching to provide a spacer mask having spacer lines adjacent to the sidewalls of each line of said series of lines of said sacrificial mask and portions of said spacer mask wrapping around the ends of each line of said series of lines, and to expose a top surface of said sacrificial mask, wherein the spacer lines adjacent to the sidewalls of each line of the series of lines of said sacrificial mask are discontinuous from the spacer lines adjacent to the sidewalls of all of the other lines of the series of lines of said sacrificial mask;
depositing and patterning a photoresist layer above said spacer mask and said sacrificial mask to form exposed portions of said spacer mask wrapping around the ends of each line of said series of lines;
etching the exposed portions of said spacer mask to crop said spacer mask by removing the portions of said spacer mask wrapping around the ends of each line of said series of lines; and, subsequent to etching said spacer mask,
removing said sacrificial mask to provide a cropped spacer mask.

2. The method of claim 1 wherein said spacer layer is comprised substantially of silicon, wherein a top portion of said sacrificial mask is comprised substantially of a material selected from the group consisting of silicon nitride and silicon oxide, and wherein etching said spacer layer to provide said spacer mask comprises using a dry etch process with a gas selected from the group consisting of $Cl_2$ and HBr.

3. The method of claim 2 wherein removing said sacrificial mask to provide said cropped spacer mask comprises using an etch process selected from the group consisting of a hot $H_3PO_4$ wet etch, an aqueous hydrofluoric acid wet etch and a SiCoNi etch.

4. The method of claim 1 wherein said spacer layer is comprised substantially of silicon oxide, wherein a top portion of said sacrificial mask is comprised substantially of a material selected from the group consisting of silicon nitride and silicon, and wherein etching said spacer layer to provide said spacer mask comprises using a dry etch process with a gas selected from the group consisting of $C_4F_8$ and $CHF_3$.

5. The method of claim 4 wherein removing said sacrificial mask to provide said cropped spacer mask comprises using an etch process selected from the group consisting of a hot $H_3PO_4$ wet etch, a SiCoNi etch, a $Cl_2$ plasma etch and a $CF_4/O_2$ plasma etch.

6. The method of claim 1 wherein said spacer layer is comprised substantially of silicon nitride, wherein a top portion of said sacrificial mask is comprised substantially of a material selected from the group consisting of silicon oxide and silicon, and wherein etching said spacer layer to provide said spacer mask comprises using a dry etch process with a gas selected from the group consisting of $CH_2F_2$ and $CHF_3$.

7. The method of claim 6 wherein removing said sacrificial mask to provide said cropped spacer mask comprises using an etch process selected from the group consisting of an aqueous hydrofluoric acid wet etch, a SiCoNi etch, a $Cl_2$ plasma etch and a $CF_4/O_2$ plasma etch.

8. The method of claim 1 wherein a frequency of spacer lines is double a frequency of said series of lines of said sacrificial mask.

9. The method of claim 8 wherein a pitch of said series of lines of said sacrificial mask is approximately 4.

10. The method of claim 1, further comprising:
transferring an image of said cropped spacer mask to a mask stack, wherein said mask stack is in said semiconductor stack below said sacrificial mask, and wherein said mask stack comprises a layer of amorphous carbon film.

* * * * *